United States Patent
Sun et al.

(10) Patent No.: US 10,381,465 B2
(45) Date of Patent: Aug. 13, 2019

(54) METHOD FOR FABRICATING ASYMMETRICAL THREE DIMENSIONAL DEVICE

(71) Applicant: Varian Semiconductor Equipment Associates, Inc., Gloucester, MA (US)

(72) Inventors: Shiyu Sun, San Jose, CA (US); Naomi Yoshida, Sunnyvale, CA (US); Benjamin Colombeau, Salem, MA (US); Hans-Joachim L. Gossmann, Summit, NJ (US)

(73) Assignee: VARIAN SEMICONDUCTOR EQUIPMENT ASSOCIATES, INC., Gloucester, MA (US)

( * ) Notice: Subject to any disclaimer, the term of this patent is extended or adjusted under 35 U.S.C. 154(b) by 71 days.

(21) Appl. No.: 14/858,077

(22) Filed: Sep. 18, 2015

(65) Prior Publication Data

US 2016/0315177 A1    Oct. 27, 2016

Related U.S. Application Data

(63) Continuation-in-part of application No. 14/744,881, filed on Jun. 19, 2015.

(60) Provisional application No. 62/150,632, filed on Apr. 21, 2015.

(51) Int. Cl.
*H01L 29/66* (2006.01)
*H01L 21/265* (2006.01)

(52) U.S. Cl.
CPC .. *H01L 29/66803* (2013.01); *H01L 21/26586* (2013.01)

(58) Field of Classification Search
None
See application file for complete search history.

(56) References Cited

U.S. PATENT DOCUMENTS

| 6,987,289 B2 | 1/2006 | Nowak |
| 7,098,477 B2 | 8/2006 | Zhu et al. |
| 8,367,498 B2 | 2/2013 | Chang et al. |
| 8,748,940 B1 | 6/2014 | Rachmady et al. |
| 2007/0298551 A1 | 12/2007 | Bouvet et al. |
| 2008/0265321 A1 | 10/2008 | Yu et al. |
| 2009/0302402 A1 | 12/2009 | Anderson et al. |
| 2013/0146942 A1 | 6/2013 | Zhu et al. |

(Continued)

OTHER PUBLICATIONS

Shiyu Sun, et al., Method for Fabricating Three Dimensional Device, U.S. Appl. No. 14/744,881, filed Jun. 19, 2015.

(Continued)

*Primary Examiner* — Jack S Chen

(57) ABSTRACT

A method of forming an asymmetrical three dimensional semiconductor device. The method may include providing a fin structure extending perpendicularly from a substrate plane and having a fin axis parallel to the substrate plane, wherein a portion of the fin structure is covered by a gate structure defining a channel region, and wherein the fin structure comprises a first end surface not covered by the gate structure and second end surface not covered by the gate structure. The method may further include directing ions in a fin treatment to the fin structure, wherein the fin treatment comprises a first treatment of the first end surface and a second treatment of the second end surface different from the first treatment.

11 Claims, 9 Drawing Sheets

(56) References Cited

U.S. PATENT DOCUMENTS

| | | |
|---|---|---|
| 2013/0187207 A1 | 6/2013 | Tang et al. |
| 2014/0187011 A1* | 7/2014 | Xu .................. H01L 29/66795 |
| | | 438/301 |
| 2015/0035061 A1 | 2/2015 | Yoon et al. |
| 2016/0111495 A1 | 4/2016 | Brand et al. |

OTHER PUBLICATIONS

J.P.Kim, et al., Design and Fabrication of Asymmetric MOSFETs Using a Novel Self-Aligned Structure, Transactions on Electron Devices, 2007, pp. 2969-2974, vol. 54.

Farshad Moradi, et al., Asymmetrically Doped FinFETs for Low-Power Robus SRAMs, IEEE Transactions on Electron Devices, 2011, pp. 4241-4249, vol. 58.

Debajit Bhattacharya, FinFETs: From Devices to Architecture, Advances in Electronics, 2014, pp. 1-21, Hindawi Publishing Corporation.

\* cited by examiner

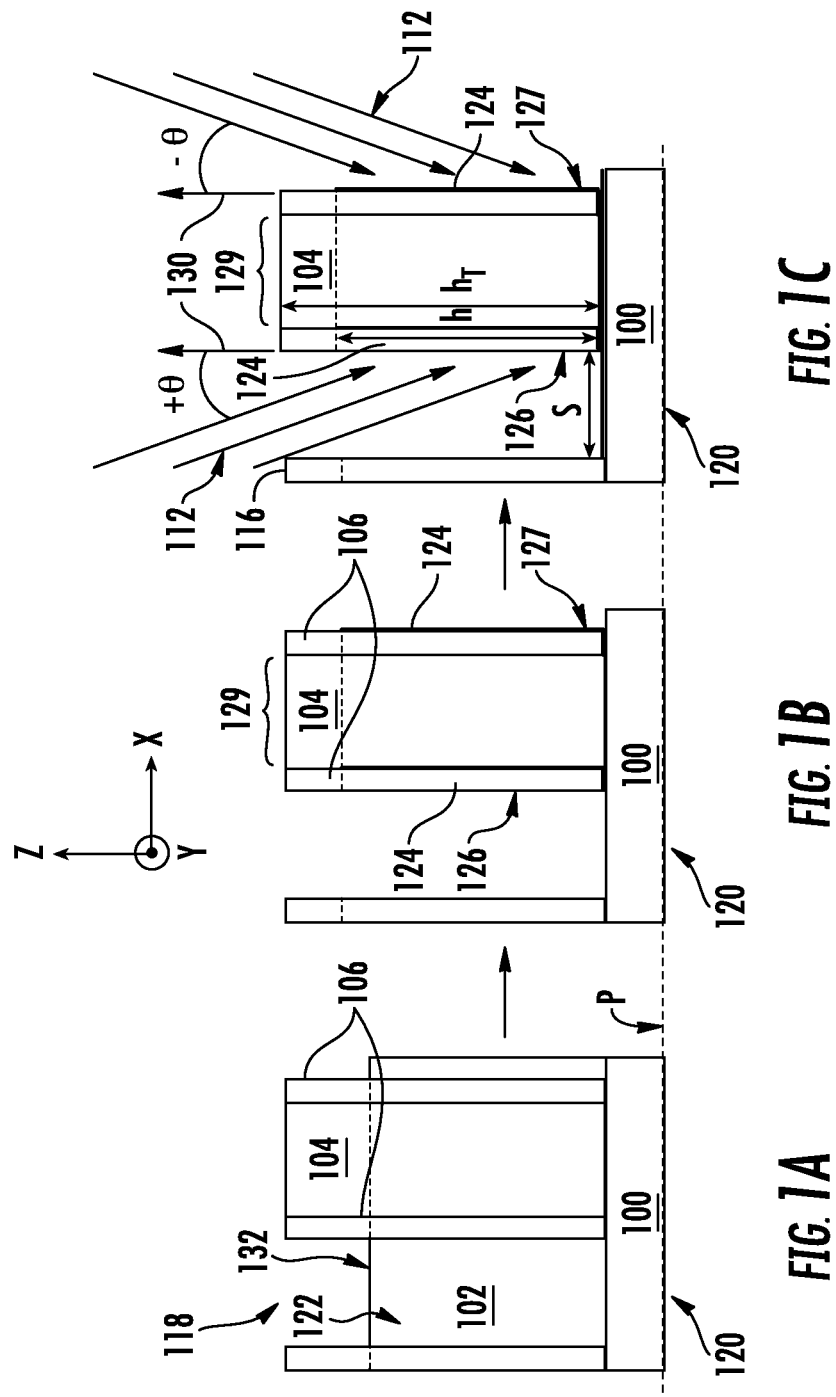

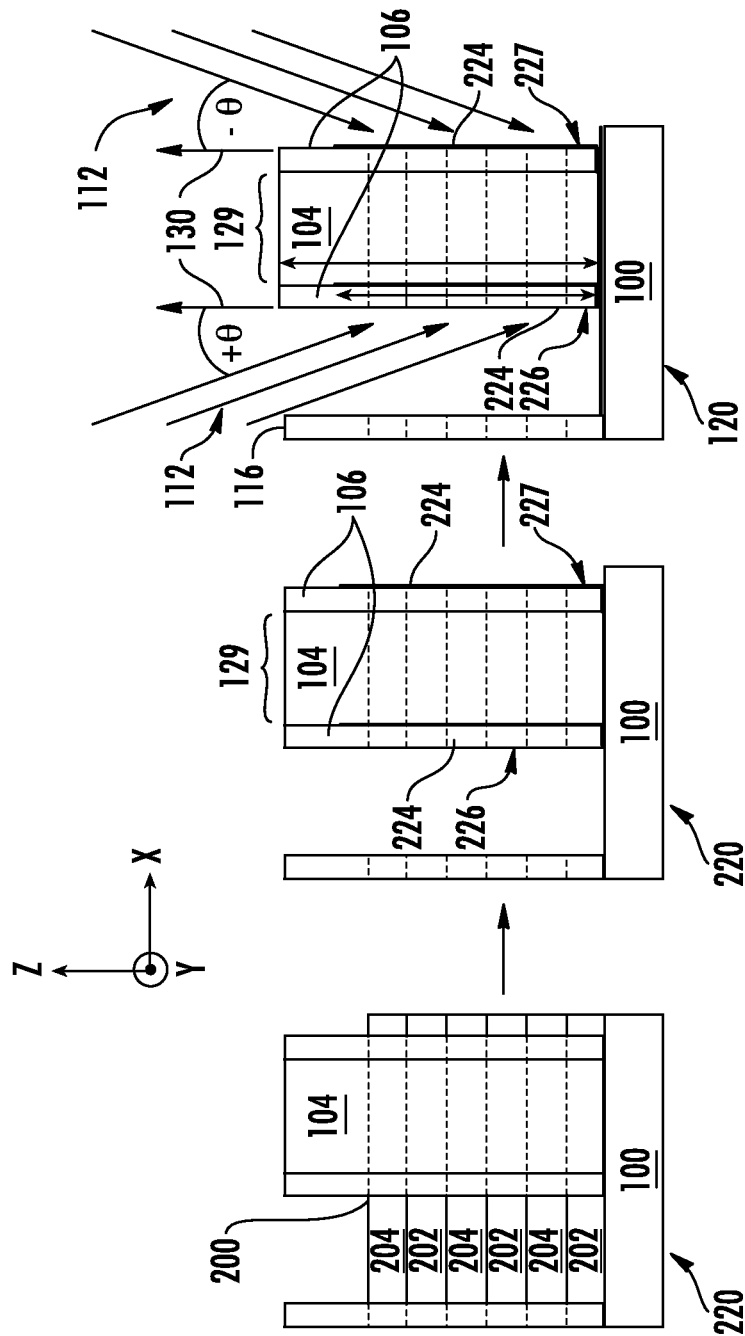

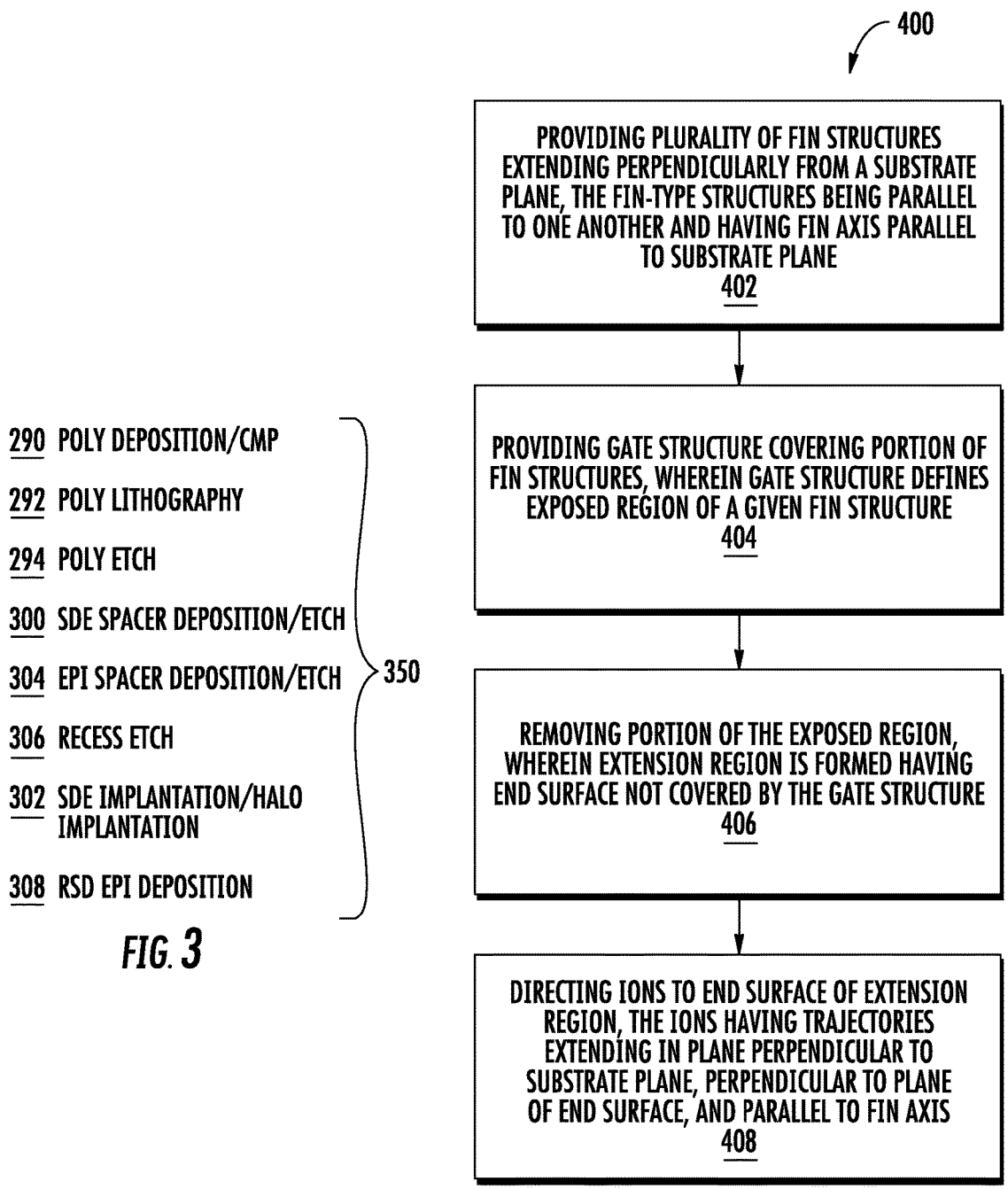

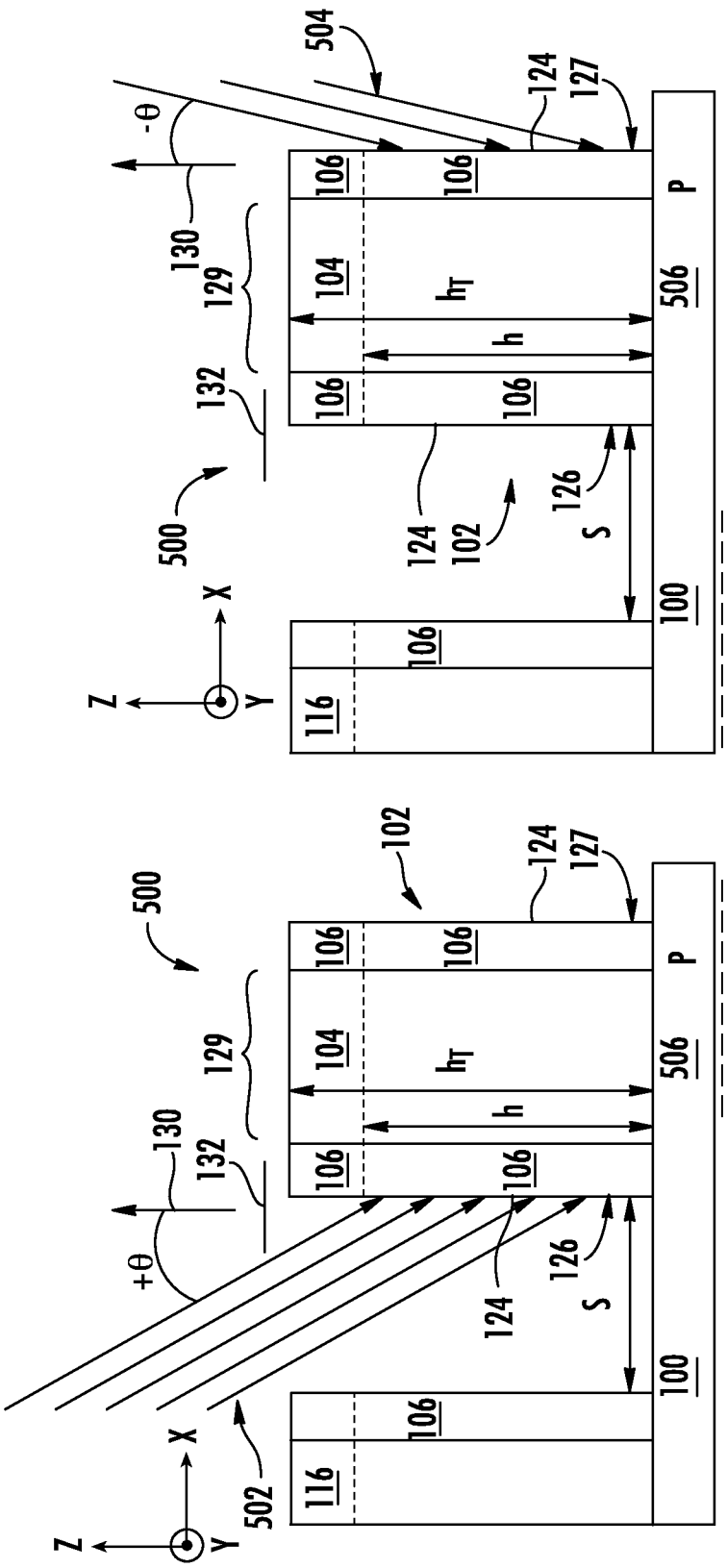

METHOD FOR FABRICATING ASYMMETRICAL THREE DIMENSIONAL DEVICE

RELATED APPLICATIONS

This application is a continuation-in-part of and claims priority to U.S. patent application Ser. No. 14/744,881, Jun. 19, 2015, and further claims priority to U.S. Provisional Patent Application No. 62/150,632, filed Apr. 21, 2015, both applications incorporated by reference herein in their entirety.

FIELD

The present embodiments relate to three dimensional device structures, and more particularly, to techniques for doping three dimensional devices.

BACKGROUND

In the present day, three dimensional transistor devices are used to provide increased performance over planar transistors. Devices such as finFET devices and horizontal-Gate-All-Around (hGAA) FETs are formed from fin-shaped semiconductor regions extending perpendicularly from a substrate plane, such as the plane of a silicon wafer. Adjacent fins in such devices may be packed close to one another where a ratio of fin structure height:fin structure spacing may approach 10:1 at certain stages in processing, accounting for extra layers including polysilicon and masking layers. Under these circumstances, implanting source/drain or source/drain extension regions of the fin structures, may be difficult because ions directed to a surface of a given fin structure are shadowed by and adjacent fin or adjacent fins.

It is with respect to these and other considerations that the present disclosure is provided.

SUMMARY

In one embodiment, a method of forming an asymmetrical three dimensional semiconductor device may include providing a fin structure extending perpendicularly from a substrate plane and having a fin axis parallel to the substrate plane, wherein a portion of the fin structure is covered by a gate structure defining a channel region, and wherein the fin structure comprises a first end surface not covered by the gate structure and second end surface not covered by the gate structure; and directing ions in a fin treatment to the fin structure, wherein the fin treatment comprises a first treatment of the first end surface and a second treatment of the second end surface different from the first treatment.

In another embodiment, a method for forming a three dimensional tunnel field effect transistor may include providing a fin structure extending perpendicularly from a substrate plane and having a fin axis parallel to the substrate plane, wherein a portion of the fin structure is covered by a gate structure defining a channel region, wherein the fin structure comprises a first end surface not covered by the gate structure and a second end surface not covered by the gate structure; directing first ions of a first dopant type to the first end surface in a first implant; and directing second ions of a second dopant type to the second end surface in a second implant, the second dopant type being opposite the first dopant type.

In a further embodiment, a method of forming a three dimensional semiconductor device may include providing a fin structure extending perpendicularly from a substrate plane and having a fin axis parallel to the substrate plane, the fin structure comprising a first extension region having a first end surface and a second extension region having a second end surface, wherein a portion of the fin structure is covered by a gate structure defining a channel region, and wherein the first end surface and second end surface are not covered by the gate structure; directing ions to the first end surface in a first implant process; and directing second ions to the second end surface in a second implant process, wherein during the first implant process and second implant process the ions have trajectories extending in a plane perpendicular to the substrate plane and parallel to the fin axis.

BRIEF DESCRIPTION OF THE DRAWINGS

FIGS. 1A to 1C illustrate a side view of a device during different stages of fabrication according to embodiments of the disclosure;

FIGS. 2A to 2C illustrate a side view of another device during different stages of fabrication according to additional embodiments of the disclosure;

FIG. 3 depicts an exemplary process flow for fabricating a device according to various embodiments of the disclosure;

FIG. 4 depicts another exemplary process flow according to further embodiments of the disclosure;

FIG. 5A, FIG. 5B and FIG. 5C depict an example of forming an asymmetrical three dimensional device according to embodiments of the disclosure;

DETAILED DESCRIPTION

Figure 1D:
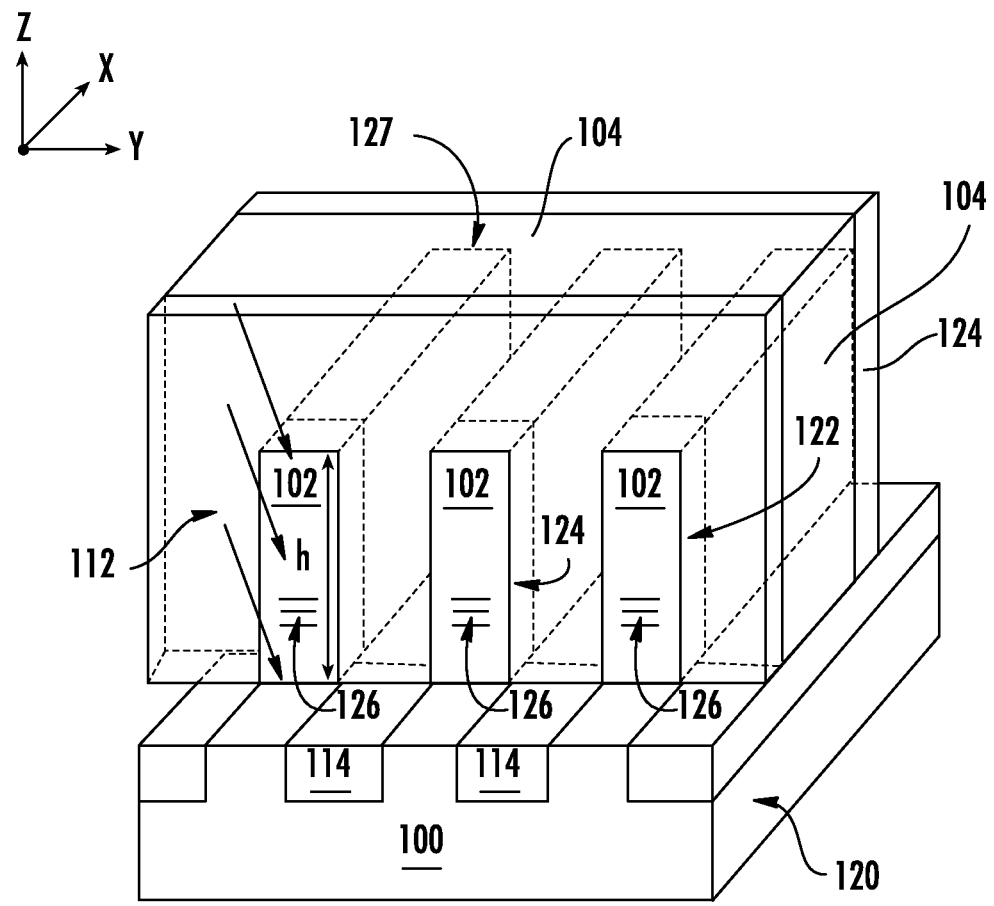
FIG. 1D depicts an end perspective view of the device of FIGS. 1A-1C during the stage depicted in FIG. 1C.

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

The embodiments described herein provide novel processing and device structures for forming three dimensional devices including multigate metal oxide semiconductor field effect transistors (MOSFETs). The terms "multigate transistor" or "multigate MOSFET" refer to a type of three dimensional device where channel regions of the transistor extend from a substrate surface to present multiple sides for contacting by a gate. Examples of multigate MOSFETs include finFET devices or hGAA FET devices, as well as vertical channel FET devices. Examples of semiconductor materials forming fin structures or similar structures of a multigate device include silicon, silicon:germanium alloys, SiC, III-V compound semiconductors, such as GaAs, GaN, InP, InGaAs, or other semiconductor materials. A characteristic of multigate MOSFETs is a given gate structure forming on various different sides of a semiconductor channel, where the semiconductor channel may be formed within a fin structure. Thus, the gate structure may act to gate the channel from various sides, as opposed to a planar MOSFET, where gating takes place from just a top side of a channel. Various embodiments facilitate improved doping of transistor features such as source/drain extension (SDE) regions, source/drain (S/D) and adjacent regions of a three dimensional field effect transistor.

FIGS. 1A to 1C illustrate a side view of a device 120 during different stages of fabrication according to embodiments of the disclosure. FIG. 1D depicts an end perspective view of the device of FIGS. 1A-1C during the stage depicted in FIG. 1C. As illustrated in FIG. 1A a fin structure 102 is disposed on a substrate 100. The fin structure 102 may, in some examples, constitute a crystalline material, such as monocrystalline silicon. The fin structure 102 extends perpendicularly from the substrate plane (X-Y plane) of substrate 100. At the stage of formation shown in FIG. 1A, a gate structure 104 is also disposed over the fin structure 102. In some cases, the gate structure 104 may be a dummy gate to be replaced at later stages of processing. As more clearly illustrated in FIG. 1D, a plurality of fin structures 102 may be arranged parallel to one another and may have a fin axis extending parallel to the X-axis (and parallel to the substrate plane P) in the Cartesian coordinate system shown. The fin axis may be parallel to a direction of current flow between S/D regions in a transistor device to be formed. As further shown in FIG. 1A, sidewalls 106 may be formed along the gate structure 104, where the gate structure 104 (and sidewalls 106) cover the fin structure 102 in a manner leaving an exposed region 118.

In known device fabrication techniques, S/D regions and SDE regions may be implanted with ions to introduce a target level of dopants for forming source regions and drain regions on opposite sides of a channel. The channel (not shown) may be formed in a portion of a fin structure covered by at least a portion of the gate structure 104. In order to introduce dopants into such S/D or SDE regions, known techniques may implant ions into a device structure, such as shown in FIG. 1A, where the ion trajectories lie within the Y-Z plane. In this known approach, the ions are implanted at a low angle of incidence with respect to the Z-axis in order to impact the sides 122 of fin structures 102 lying in the X-Z plane. Because of the height of the fin structures 102 along the Z-direction and close spacing of fin structures 102 along the Y-direction, ions are directed toward the sides 122 at angles of approximately 7 degrees or less with respect to the Z-axis in some known techniques.

According to various embodiments of the disclosure, an innovative technique provides improvements on the aforementioned approach. An example of this novel and innovative technique is illustrated in FIG. 1B and FIG. 1C. In FIG. 1B, a portion of the exposed region 118 is removed from the fin structure 102. In this example, the fin structure 102 may be etched at least to the substrate 100. The embodiments are not limited in this context.

When the fin structure 102 is etched, as shown in FIG. 1B, an extension region 124 is formed presenting an end surface 126. A portion of the fin structure 102 is covered by the gate structure 104, defining a channel region 129.

The end surface 126 forms an end surface of the fin structure 102 at this stage of processing, and represents a surface not covered by the gate structure 104 or the sidewalls 106. Likewise, on an opposite end of the fin structure 102, a second extension region, also designated as extension region 124, is formed. On this opposite end of the fin structure 102, the extension region has an end surface 127, also not covered by the gate structure 104 or sidewalls 106. As illustrated, the end surface 126 and end surface 127 may lie parallel to the Y-Z plane.

Turning now to FIG. 1C, after the exposed region 118 is etched forming the extension region 124, ions 112 may be directed to the extension regions 124. In particular, the ions 112 may be directed to the end surface 126 and the end surface 127. The ions 112 may be implanted into an extension region 124 in one implant process or a plurality of implant processes, to act as a source/drain extension (SDE) doping implant, and may additionally act as ions for "halo" doping, for example. In this embodiment, the ions 112 may be directed along trajectories lying within the X-Z plane, where the X-Z plane is perpendicular to a substrate plane P lying parallel to the X-Y plane. The end surface 126 and end surface 127 may lie parallel to the Y-Z plane. Accordingly, the trajectories of ions 112 may lie within a plane perpendicular to a plane of the end surface 126 and a plane of the end surface 127. The ions 112 may have trajectories also forming a non-zero angle of incidence, shown as an angle of incidence θ with respect to a perpendicular 130 to the substrate plane P. As illustrated in FIG. C, ions 112 may be directed in one implant process at an angle of +θ to the end surface 126 and in a second implant process at an angle of −θ to the end surface 127. In one example, where the ions 112 are dopant ions, the ions may form a first source drain extension when implanted through the end surface 126, and a second source/drain extension when implanted through the end surface 127. The two source/drain extensions may form two junctions defining opposite ends of a channel extending along the X-axis through the fin structure 102. Subsequently, to the operations depicted in FIGS. 1A-1C, a source/drain region may be regrown into the exposed region 118. Notably, the angle −θ and angle +θ may have the same magnitude or different magnitude.

An advantage of the approach depicted in FIGS. 1A-1C, is the ability to provide ions 112 at an angle of incidence θ greater than in known processing of finFET structures or hGAA FET structures. In the known approaches, SDE implantation may take place into a device structure at the stage illustrated in FIG. 1A, for example. The maximum tilt-angle may be defined as an angle, ant, $\theta_{crit}$, where an incident ion 112 is able to reach the bottom of the end surface 126 while not being blocked by the top of adjacent structure 116. The maximum tilt angle can be calculated as $\theta_{crit}$=arctan(<distance S along X axis between adjacent structure 116 and the gate structure 104 including sidewall 106>/<height $h_T$, the total gate height from the bottom of the fin structure 102 to the top of the gate structure 104>), or more simply, ($S/h_T$). This distance S, as shown in FIG. 1C, represents the distance along the X-axis between the end surface 126 and the adjacent structure 116. Notably, in the approach shown in FIGS. 1A-1C, the adjacent structure 116 is located on the same fin string as the fin structure 102 located under gate structure 104, and hence is of the same polarity. Accordingly, the adjacent structure 116 does not have a mask, such as resist, when ion implantation is performed into the extension region 124. By way of comparison, for known approaches, where the SDE implant takes place into the sides 122 of a fin structure 102, ions 112 now incident with a tilt in the Y-Z plane have to clear adjacent fin structures 102 (see FIG. 1D). Frequently, adjacent fin structures (see fin structure 102) are of opposite polarity to one another so a first fin structure is protected by a mask (not shown in the FIGS.) when an adjacent fin structure is implanted. The thickness of this mask has to be taken into account by adding to the denominator in the aforementioned formula for $\theta_{crit}$, making $\theta_{crit}$ smaller for known implantation approaches where ions have a tilt in the Y-Z plane and are implanted into the sides 122 of a fin structure 102. In one particular example, for a 7 nm technology node, ions 112 may be directed to the end surfaces 126 at an angle of incidence of 10 degrees to 12 degrees, and in particular at an angle of incidence of 12 degrees with respect to the perpendicular 130. In comparison, a maximum angle for ions when directed at sides of fin structures according to know techniques for the same technology node is 7 degrees.

By way of comparison, for a given tilt-angle, ions implanted using a known approach, being tilted in plane Y-Z and incident into the sides 122 of the fin structure 102, also implant the top surface 132 of a fin structure 102 in the exposed region 118. The incident angle for the top surface 132 is given by the tilt-angle $\theta$, as regards the sides 122 of the fin structures 102, the incidence angle may be expressed as 90-$\theta$. This difference results in a much larger effective dose to be implanted into the top surface 132 than the sides 122 of the fin structure 102, leading to much higher dopant volume concentration and more lateral penetration of dopant into the channel during implant and during subsequent thermal treatment at the top region of the fin. In contrast, directing the ions 112 with a tilt in the X-Z plane into the end surface 126 gives the same incident angle irrespective of where the ions impinge along the height, h, of end surface 126, leading to better junction planarity.

Figure 2D:
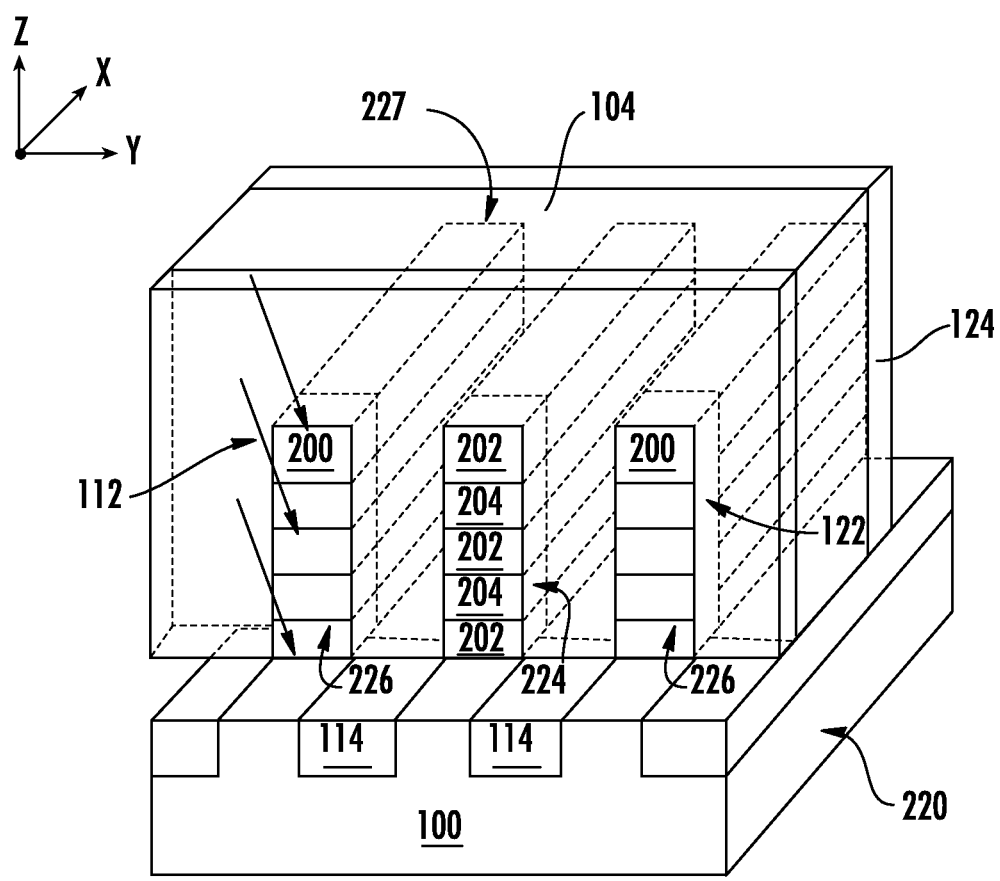
FIG. 2D depicts an end perspective view of the device of FIGS. 2A-2C during the stage depicted in FIG. 2C.

FIGS. 2A to 2C illustrate a side view of a device 220 during different stages of fabrication according to additional embodiments of the disclosure. FIG. 2D depicts an end perspective view of the device of FIGS. 2A-2C during the stage depicted in FIG. 2C. As illustrated in FIG. 2A, a fin structure 200 is disposed on a substrate 100. The fin structure 200 may, in some examples, constitute a plurality of different semiconductor layers, such as at least three layers. In some cases, at least one layer may comprise a first semiconductor material and at least one layer may comprise a second semiconductor material. In one example, a first semiconductor layer 202 may alternate with a second semiconductor layer 204. The first semiconductor layer 202 may be monocrystalline silicon and the second semiconductor layer 204 may be monocrystalline silicon:germanium, in one example. The fin structure 200, may serve as the basis to form a horizontal-gate-all-around device structure (hGAA FET structure) by selectively etching the first semiconductor layer 202 or the second semiconductor layer 204 with respect to respective layers, second semiconductor layer 204 or first semiconductor layer 202, as known in the art. In other respects, processing of the fin structure 200 may proceed as described above with respect to FIGS. 1A-1D. Accordingly, the end surface 226 and end surface 227 of extension regions 224 may be implanted by ions 112 at a greater angle of incidence $\theta$ than is achievable by known techniques where ions are directed toward sides of fin structures 200 within the Y-Z plane.

In the embodiments of FIG. 1A to FIG. 2C, the ability to direct ions into end surfaces of a fin structure may provide more uniform doping as opposed to the approach of known techniques of directing ions into sidewalls of a fin structure. Simulations have been carried source/drain extension implants are performed upon fin structures using the approach generally illustrated by the FIGS. 1A-2C (where ions lie in the X-Z plane) and a conventional source/drain extension ion implantation process of directing ions into fin sidewalls (where ions lie in the Y-Z plane). Results show junctions between the source/drain extension region formed by the techniques of the present embodiments are more uniform as compared to the conventional approach. Additionally, the variation in effective channel length ($L_{eff}$) within a device is smaller according to the present embodiments as compared to the conventional approach. This may, in part, arise from the implanting of ions directly into the end surface 126 or end surface 127, where the end surfaces lie parallel (in the Y-Z plane) to the target junctions to be created by the source/drain extension implants. In this manner, the ions being implanted may be distributed uniformly over the end surface 126 and end surface 127, and may be implanted at a more uniform depth with respect to end surface 126 and end surface 127.

FIG. 3 depicts an exemplary process flow 350 for fabricating a device, according to various embodiments of the disclosure. The exemplary process flow 350 may represent a portion of operations employed to fabricate an hGAA transistor, for example. In a first operation 290, polysilicon deposition may be followed by chemical-mechanical polishing (CMP). In the operation 292, lithography may be applied to the deposited polysilicon to define a gate pattern. At operation 294, etching may be performed to define gate structures. In the subsequent operations shown in FIG. 3, a conventional sequence may be represented by: the operation 300, SDE spacer deposition and etch; operation 302, SDE implant/halo implant; operation 304, epitaxial spacer deposition and etch; operation 306, recess etch; and operation 308, raised source/drain epitaxial deposition. Such a conventional sequence may entail for operation 302, the directing of ions at the sidewalls of fin structures at relatively lower angles, such as 7 degrees, as noted above. Subsequently, during the recess etch of operation 306, an exposed region of the fin may be etched away to allow for growth of the raised source/drain, in operation 308. In accordance with an embodiment of the disclosure, the operation 302 may be moved so the new sequence of operations proceeds as: operation 300, operation 304, operation 306, operation 302, and operation 308. Additionally, the operation 302 may entail direction ions toward the end surface of fin structures at relatively larger angles, such as 12 degrees, as discussed above.

FIG. 4 depicts another exemplary process flow 400 according to additional embodiments of the disclosure. At block 402, a plurality of fin structures are provided, extending perpendicularly from a substrate plane, where the fin-type structures are parallel to one another and have a fin axis. In different embodiments, the fin structures may be formed from monocrystalline silicon or from a plurality of different semiconductor layers. In one example, a first semiconductor layer of the fin structure may alternate with a second semiconductor layer. The first semiconductor layer may be monocrystalline silicon and the second semiconductor layer may be a monocrystalline silicon:germanium alloy, in one example.

At block 404, a gate structure is provided, covering a portion of the fin structures, wherein the gate structure defines an exposed region of a given fin structure.

At block 406, a portion of the exposed region is removed, wherein an extension region is formed having an end surface not covered by the gate structure.

At block 408, ions are directed to the extension region, where the ions have trajectories extending in a plane perpendicular to the substrate plane, perpendicular to a plane of the end surface, and parallel to the fin axis.

Figure 5C:
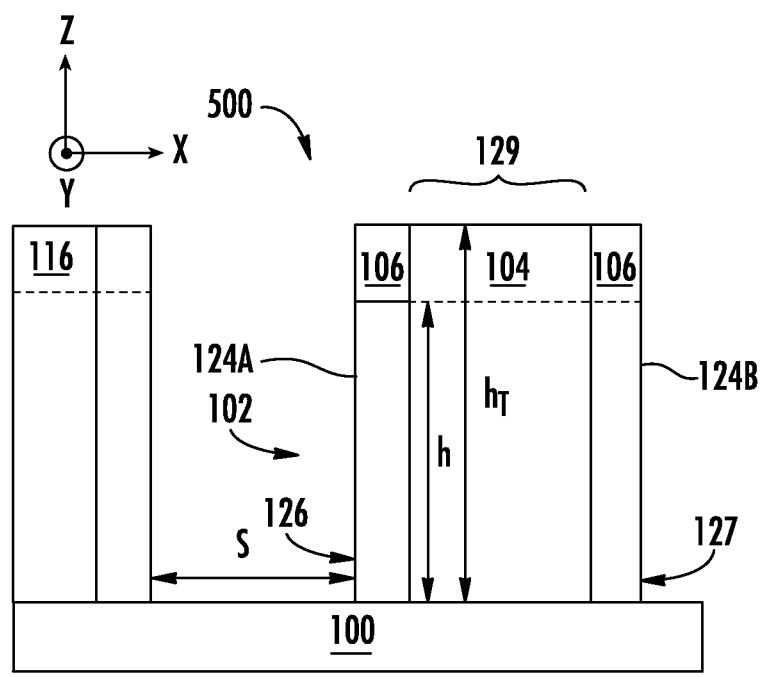

FIG. 5A and FIG. 5B depict an example of forming an asymmetrical three dimensional device, according to embodiments of the disclosure. FIG. 5A depicts an initial operation for implanting a device 500, while FIG. 5B depicts a subsequent operation for implanting the device 500. In various embodiments, before the operation of FIG. 5A, the device 500 may be fabricated, as generally shown in FIG. 1A and FIG. 1B, wherein a fin structure 102 having a first end surface and second end surface are formed, in other words, end surface 126 and end surface 127. The operations of FIG. 5A and FIG. 5B may be employed to generate an asymmetrical three dimensional device, such as a finFET or other device having an asymmetrical source/drain, where electrical or electronic properties of a source region differs from electronic properties of a drain region. A resulting device, shown as the device 500, is shown in FIG. 5C, where an extension region 124A is formed on the left side of fin structure 102 and an extension region 124B is formed on the right side of fin structure 102. The combination of operations shown in FIG. 5A and FIG. 5B may be deemed to constitute a fin treatment, where the operation in FIG. 5A constitutes a first treatment of the end surface 126, while the operation of FIG. 5B constitutes a second treatment of the end surface 127.

In particular, in FIG. 5A, ions 502 may directed to the end surface 126, while in FIG. 5B, ions 504 are directed to the end surface 127. As generally described above with respect to FIG. 1C, the ions 502 and ions 504 may have trajectories extending in a plane perpendicular to the substrate plane P and parallel to the fin axis of fin structure 102. In the example of FIGS. 5A and 5B, the ions 502 and ions 504 may have trajectories lying in the X-Z plane. Accordingly, the trajectories of ions 502 and ions 504 may lie within a plane perpendicular to the plane of the end surface 126 and end surface 127.

As suggested in FIG. 5A and FIG. 5B, the first treatment may differ from the second treatment. For example, a first implant process as represented by the ions 502 of FIG. 5A may differ from a second implant process as represented by the ions 504 of FIG. 5B in at least one of: ion energy, angle of incidence, ion dose, and dopant type.

With regards to differing angle of incidence, ions 502 may be directed at an angle of +θ to the end surface 126 while ions 504 are directed at an angle of −θ to the end surface 127. Notably, the angle −θ and angle +θ may have a different magnitude with respect to the perpendicular 130. In other examples, ions 502 may have a first ion energy while ions 504 have a second ion energy different from the first ion energy. For example, ions 502 may have an energy of 500 eV while ions 504 have an energy of 1000 eV. The embodiments are not limited in this context. In the case where ions 502 and ions 504 are dopant ions, this differing ion energy may result in generating a shallower junction in extension region 124A as opposed to extension region 124B. In other examples, the ions 502 may be provide at a first ion dose and the ions 504 may be provided at a second ion dose different from the first ion dose. This differing ion dose or difference in other parameters may result in differing resistivity, gate overlap, capacitance and/or contact resistance in extension region 124A as opposed to extension region 124B.

In some embodiments, a first anneal may be performed between a first treatment, as shown in FIG. 5A and a second treatment, as shown in FIG. 5B. Subsequently, according to different embodiments, a second anneal may or may not be performed after the second treatment. In this manner, dopant ions implanted to form extension region 124A may experience a different thermal budget than dopant ions implanted to form extension region 124B.

In other embodiments, a fin treatment may constitute a first treatment where ions are implanted into a first end surface of a fin structure and no ions are implanted into a second end surface. The fin structure may be subsequently annealed, in some examples.

In various additional embodiments, the treatment of end surface 126 may differ from the treatment of end surface 127 by any combination of ion energy, ion dose, angle of incidence of ions, dopant type of ions, and annealing of the different end surfaces.

In the aforementioned examples, the resulting device, device 500 may be an asymmetric three dimensional device forming a type of asymmetric source/drain MOSFET. The device 500 may accordingly exhibit better performance as compared to a symmetric source/drain device. For example, a source side of the device 500 may have higher doping concentration than the drain side. Because the source side resistance dominates the on-current behavior of such a transistor, the higher resistance of the more lightly doped drain side is immaterial to the saturation drain current $I_{DSAT}$. The lower doping level in a drain region may also reduce leakage components such as gate induced drain leakage (GIDL) by reducing the electric field in the drain region.

As described above, because ions such as ions 502 may be directed at the end surface of an extension region of a fin structure, rather than a sidewall of a fin structure, just one end surface may be exposed in a given implantation process. Accordingly, asymmetrical S/D MOSFETs may be fabricated without complicated masking procedures between implantation of a source side of the fin structure and implantation of a drain side of the fin structure.

In accordance with further embodiments, the operations generally shown in FIGS. 5A-5C may be employed to form a tunnel field effect transistor (TFET), and in particular, a three dimensional tunnel field effect transistor. In a TFET, a source region may be formed of a first dopant type, such as a p-doped semiconductor, while a drain region is formed of dopants of a second dopant type opposite the first dopant type, such as an n-doped semiconductor. The channel region may be intrinsic semiconductor material. Accordingly, in the operations of FIG. 5A and FIG. 5B, a channel region 506 may be undoped, while the ions 502 constitute p-type dopants and the ions 504 constitute n-type dopants.

Figure 6:
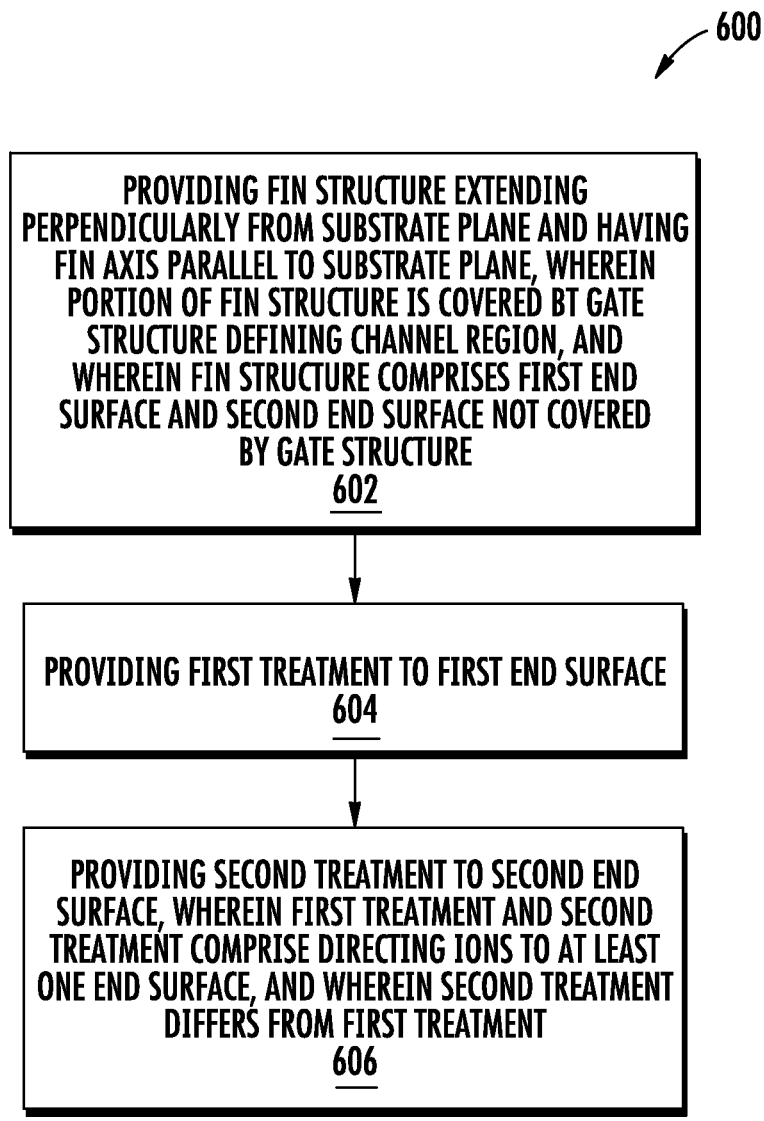
FIG. 6 depicts an additional exemplary process flow according to further embodiments of the disclosure.

FIG. 6 depicts an additional exemplary process flow 600, according to further embodiments of the disclosure. At block 602, the operation is performed of providing a fin structure extending perpendicularly from a substrate plane and having a fin axis parallel to a substrate plane, wherein a portion of the fin structure is covered by a gate structure defining a channel region. The fin structure may comprise a first end surface and a second end surface where the first end surface and second end surface are not covered by the gate structure. In various embodiments, the fin structure comprises a monocrystalline semiconductor material.

At block 604, the operation is performed of providing a first treatment to the first end surface. In various embodiments, the first treatment may involve implanting first ions having trajectories extending in a plane perpendicular to the substrate plane and parallel to the fin axis. At block 606, the operation is performed of providing a second treatment to the second end surface, wherein the first treatment and second treatment comprise directing ions to at least one end surface, and wherein second treatment differs from first treatment. In some examples, the second treatment may also involve implanting second ions having trajectories extending in a plane perpendicular to the substrate plane and parallel to the fin axis. According to various embodiments, the implanting of first ions and implanting of second ions may differ between one another in at least one of: ion energy, ion dose, angle of incidence, dopant type of implanting ions, among other features.

Figure 7:
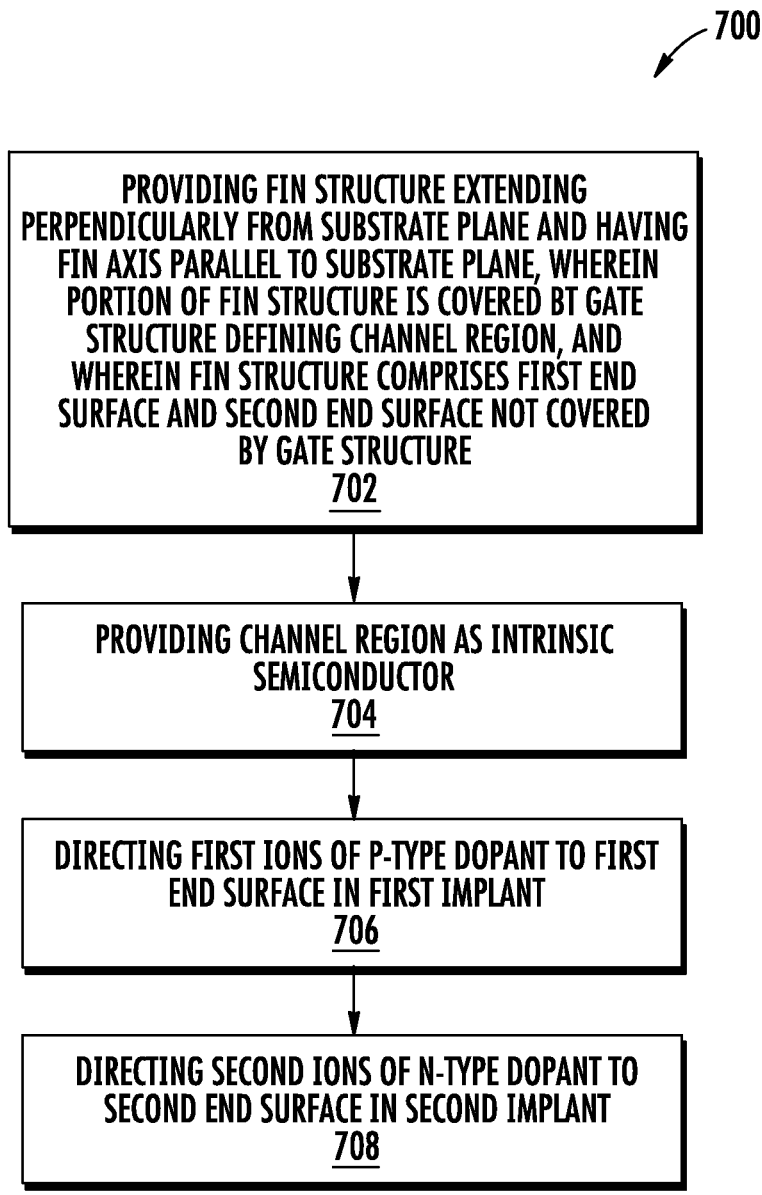
FIG. 7 depicts a further exemplary process flow according to other embodiments of the disclosure.

FIG. 7 depicts a further exemplary process flow 700, according to other embodiments of the disclosure. At block 702, the operation is performed of providing a fin structure extending perpendicularly from a substrate plane and having a fin axis parallel to the substrate plane, wherein a portion of the fin structure is covered by a gate structure defining a channel region. The fin structure further comprises a first end surface and a second end surface, where the first end surface and second end surface are not covered by the gate structure. In various embodiments, the fin structure comprises a monocrystalline semiconductor material.

In block 704, the channel region is provided as an intrinsic semiconductor. At block 706, the operation is performed of directing first ions of a p-type dopant to the first end surface in a first implant. At block 708, the operation is performed of directing second ions of an n-type dopant to the second end surface in a second implant. In some embodiments, an optional anneal may be performed between the block 706 and block 708. In various embodiments, the first implant and the second implant may involve implanting ions having trajectories extending in a plane perpendicular to the substrate plane and parallel to the fin axis.

Advantages provided by the present embodiments include the ability to implant ions into a fin structure for source/drain extension doping at a greater angle of incidence with respect to a fin surface being implanted in comparison to known approaches. For example, because implantation may be performed along a given fin string where adjacent structures have a same polarity, resist is not present on a structure adjacent to the fin structure on the same fin string being implanted. This allows ions to penetrate more uniformly into a fin surface as opposed to more grazing angles of incidence employed by conventional approaches, such as 7 degrees. Another advantage is the ability to direct dopants into a fin structure in a more uniform manner, since dopants may implant into an entire end surface representing a cross-section of a fin structure where the ions uniformly "illuminate" this cross-section. As a result, the present embodiments may generate a more planar junction as opposed to conventional approaches. Further advantages of the present embodiment include the ability to fabricate asymmetric devices such as asymmetric source/drain devices without masking steps to mask source or drain regions during implantation of the drain or source regions, as is the case in conventional asymmetric S/D schemes.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method of forming an asymmetrical three dimensional semiconductor device, comprising:
   providing a fin structure extending perpendicularly from a substrate plane and having a fin axis, the fin axis lying parallel to the substrate plane, and parallel to a direction of current flow through a channel region, wherein a portion of the fin structure is covered by a gate structure defining the channel region, wherein the fin structure comprises a top surface that is covered by the gate structure, and wherein the fin structure comprises a first end surface not covered by the gate structure and second end surface not covered by the gate structure; and
   directing ions in a fin treatment to the fin structure, wherein the fin treatment comprises a first treatment of the first end surface and a second treatment of the second end surface different from the first treatment, wherein the top surface does not extend beyond the gate structure in a direction parallel to the fin axis during the fin treatment, and wherein the top surface extends from the first end surface to the second end surface during the fin treatment.

2. The method of claim 1, wherein during the fin treatment the ions have trajectories extending in a plane perpendicular to the substrate plane and parallel to the fin axis.

3. The method of claim 1, wherein the first treatment comprises a first ion dose and the second treatment comprises a second ion dose different from the first ion dose.

4. The method of claim 1, wherein the first treatment comprises a ions having a first ion energy and the second treatment comprises ions having a second ion energy different from the first ion energy.

5. The method of claim 1, wherein the first treatment comprises ions having trajectories forming a first angle of incidence with respect to a perpendicular to the substrate plane, and the second treatment comprises ions having trajectories forming a second angle of incidence with respect to a perpendicular to the substrate plane different from the first angle of incidence.

6. The method of claim 1, wherein the first treatment comprises directing ions of a first dopant type to the first end surface, and the second treatment comprises directing ions of a second dopant type to the second end surface.

7. The method of claim 1, wherein the ions comprise trajectories forming an angle of incidence of 10 degrees to 12 degrees with respect to a perpendicular to the substrate plane.

8. The method of claim 1 wherein the ions are provided as a source/drain extension implant to the first end surface and second end surface.

9. The method of claim 1, further comprising performing a first anneal between the first treatment and the second treatment.

10. The method of claim 1, wherein the second treatment comprises no ions.

11. The method of claim 1, wherein the first treatment comprises directing first ions to the first end surface and performing a first anneal, and wherein the second treatment comprises directing second ions to the second end surface after the first anneal and performing a second anneal.

* * * * *